(12) United States Patent
Kamada et al.

(10) Patent No.: US 9,583,543 B2
(45) Date of Patent: Feb. 28, 2017

(54) ANTIREFLECTION FILM AND ORGANIC LIGHT EMITTING DEVICE INCLUDING THE SAME

(71) Applicant: Samsung Electronics Co., Ltd., Suwon-si (KR)

(72) Inventors: Koh Kamada, Suwon-si (KR); Tsuyoshi Ohyama, Suwon-si (KR); Eun Sung Lee, Hwaseong-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 14/726,159

(22) Filed: May 29, 2015

(65) Prior Publication Data

US 2016/0161785 A1 Jun. 9, 2016

(30) Foreign Application Priority Data

Dec. 8, 2014 (KR) ........................ 10-2014-0174872

(51) Int. Cl.
| | |
|---|---|
| *H01L 29/08* | (2006.01) |
| *H01L 35/24* | (2006.01) |
| *H01L 51/00* | (2006.01) |
| *H01L 27/32* | (2006.01) |
| *G02B 5/30* | (2006.01) |
| *H01L 51/52* | (2006.01) |
| *G02F 1/13363* | (2006.01) |

(52) U.S. Cl.
CPC ........ *H01L 27/3232* (2013.01); *G02B 5/3016* (2013.01); *G02B 5/3083* (2013.01); *H01L 51/5281* (2013.01); *G02F 2001/133638* (2013.01)

(58) Field of Classification Search
CPC ..... G02F 1/13363; G02F 2001/133638; G02F 2001/133637; G02F 1/133512; G02F 1/133707; H01L 27/3232
See application file for complete search history.

(56) References Cited

U.S. PATENT DOCUMENTS

| | | | |
|---|---|---|---|
| 5,567,349 | A | 10/1996 | Kelly et al. |
| 6,339,114 | B1 | 1/2002 | Klee et al. |
| 7,227,602 | B2 | 6/2007 | Jeon et al. |
| 7,336,857 | B2 | 2/2008 | Kawahara et al. |

(Continued)

FOREIGN PATENT DOCUMENTS

| | | |
|---|---|---|
| EP | 1879242 | 1/2008 |
| JP | 3325560 | 7/2002 |

(Continued)

OTHER PUBLICATIONS

Korean Office Action-Korean Application No. 10-2014-0174872 dated Jan. 7, 2016.

(Continued)

*Primary Examiner* — Thanh Y Tran
(74) *Attorney, Agent, or Firm* — Cantor Colburn LLP

(57) ABSTRACT

An organic light emitting device includes an anti-reflection film including a polarizer and a compensation film positioned on the polarizer and including a liquid crystal layer which includes liquid crystals having oriented direction tilting obliquely with respect to a surface of the liquid crystal layer extending in a horizontal direction in a cross sectional view.

16 Claims, 8 Drawing Sheets

(56) References Cited

U.S. PATENT DOCUMENTS

| | | | |
|---|---|---|---|
| 7,625,612 B2 | 12/2009 | Ohmori et al. | |
| 7,852,561 B2 | 12/2010 | Chiba et al. | |
| 8,119,026 B2 | 2/2012 | Parri et al. | |
| 8,425,991 B2 | 4/2013 | Nimura et al. | |
| 8,512,824 B2 | 8/2013 | Kasianova et al. | |
| 8,547,512 B2* | 10/2013 | Lee | G02F 1/133707 349/129 |
| 8,574,689 B2 | 11/2013 | Shin et al. | |
| 8,599,339 B2 | 12/2013 | Lee et al. | |
| 8,687,259 B2 | 4/2014 | Adlem et al. | |
| 2005/0237455 A1* | 10/2005 | Fujioka | G02F 1/133512 349/114 |
| 2006/0221281 A1* | 10/2006 | Kobayashi | G02F 1/13363 349/117 |
| 2006/0232733 A1 | 10/2006 | Shibazaki | |
| 2006/0246232 A1 | 11/2006 | Kubo et al. | |
| 2006/0274229 A1 | 12/2006 | Ito et al. | |
| 2008/0252827 A1 | 10/2008 | Hirai et al. | |
| 2008/0273151 A1 | 11/2008 | Kuo et al. | |
| 2009/0122237 A1 | 5/2009 | Fukagawa et al. | |
| 2009/0257003 A1 | 10/2009 | Yoshihara et al. | |
| 2010/0045910 A1* | 2/2010 | Bitou | G02B 5/305 349/118 |
| 2010/0157204 A1 | 6/2010 | Ichihashi et al. | |
| 2012/0037928 A1 | 2/2012 | Shim et al. | |
| 2012/0108781 A1 | 5/2012 | Adlem et al. | |
| 2013/0044286 A1 | 2/2013 | Yoon et al. | |
| 2013/0140587 A1 | 6/2013 | Lim et al. | |
| 2013/0249378 A1 | 9/2013 | Murakami et al. | |

FOREIGN PATENT DOCUMENTS

| | | |
|---|---|---|
| JP | 2004125830 | 4/2004 |
| JP | 2004-341207 A | 12/2004 |
| JP | 2005-164957 A | 6/2005 |
| JP | 2006309024 | 11/2006 |
| JP | 2006-337676 A | 12/2006 |
| JP | 2007206307 | 8/2007 |
| JP | 2009169086 | 7/2009 |
| JP | 2010-026091 A | 2/2010 |
| JP | 2010084032 | 4/2010 |
| JP | 4548726 | 7/2010 |
| JP | 2010151910 | 7/2010 |
| JP | 2010522892 | 7/2010 |
| JP | 4803363 | 8/2011 |
| JP | 2011194715 | 10/2011 |
| JP | 2012007160 | 1/2012 |
| JP | 2012035445 | 2/2012 |
| JP | 2012150477 | 8/2012 |
| JP | 5079150 | 9/2012 |
| JP | 2013114141 | 6/2013 |
| JP | 5505566 | 3/2014 |
| JP | 2014-186351 A | 10/2014 |
| JP | 2014-224926 A | 12/2014 |
| JP | 2015-161714 A | 9/2015 |
| KR | 1020040025862 | 3/2004 |
| KR | 1020050070616 | 7/2005 |
| KR | 1020060089402 | 8/2006 |
| KR | 1020080027749 | 3/2008 |
| KR | 1020080092303 | 10/2008 |
| KR | 1020090003296 A | 1/2009 |
| KR | 1020100073751 | 7/2010 |
| KR | 1020110103068 | 9/2011 |
| KR | 1020120055129 | 5/2012 |
| KR | 1020120116887 | 10/2012 |
| KR | 1020130072048 | 7/2013 |
| KR | 1020150038836 | 4/2015 |
| WO | 2007064039 | 6/2007 |
| WO | 2007142037 | 12/2007 |
| WO | 2013125211 | 8/2013 |
| WO | 2013157888 | 10/2013 |
| WO | 2014073616 | 5/2014 |
| WO | 2015/122387 A1 | 8/2015 |

OTHER PUBLICATIONS

Extended European Search Report—European Patent Application No. 15198495.2 dated Apr. 14, 2016.
Notice of Allowance-Korean Application No. 10-2014-0174872 dated Jun. 12, 2016.
Extended European Search Report dated Apr. 14, 2016 of the corresponding European Patent Application No. 15198492.2.
Korean Office Action dated Jan. 7, 2016, of the corresponding Korean Patent Application No. 10-2014-0174872 w/English Translation.
Japanese Office Action for Japanese Patent Application No. 2015-239173 dated Jul. 15, 2016 with English Translation.

* cited by examiner

ANTIREFLECTION FILM AND ORGANIC LIGHT EMITTING DEVICE INCLUDING THE SAME

CROSS-REFERENCE TO RELATED APPLICATION

This application claims priority to Korean Patent Application No. 10-2014-0174872 filed on Dec. 8, 2014, and all the benefits accruing therefrom under 35 U.S.C. §119, the entire contents of which are incorporated herein by reference.

BACKGROUND

1. Field

An anti-reflection film and an organic light emitting device including the same are disclosed.

2. Description of the Related Art

Recently, as lightness and thinness of a display device such as a monitor, a television, or the like have been desired, an organic light emitting device ("OLED") has drawn attention. The OLED is a self light-emitting display device, which does not need a separate backlight, and thus may realize a thin and flexible display device.

The OLED may reflect external light by a metal electrode and a metal line of the organic light emitting panel, and the visibility and the contrast ratio may be deteriorated by reflection of the exterior light, thereby reducing display quality. In order to reduce the deterioration, a circular polarizing plate is attached to one surface of an organic light emitting panel and thus leakage of the reflected external light to the outside may be reduced.

SUMMARY

One exemplary embodiment provides an anti-reflection film capable of improving display characteristics by decreasing viewing angle dependency without increasing a thickness.

Another exemplary embodiment provides an organic light emitting device ("OLED") including the anti-reflection film.

According to one exemplary embodiment, an anti-reflection film includes a polarizer and a compensation film positioned on the polarizer and including a liquid crystal layer which includes liquid crystals having oriented direction tilting obliquely with respect to a surface of the liquid crystal layer extending in a horizontal direction in a cross sectional view.

In an exemplary embodiment, the liquid crystal layer may further include a first side and a second side facing each other, and tilt angles of the liquid crystals may become gradually larger from the first side to the second side.

In an exemplary embodiment, the first side of the liquid crystal layer may face the polarizer.

In an exemplary embodiment, a maximum tilt angle of the liquid crystals may range from about 30 degrees (° to about 75°.

In an exemplary embodiment, a tilt angle of the tilt angles of the liquid crystals positioned at the first side may be greater than about 0° and less than or equal to about 5°.

In an exemplary embodiment, the compensation film may further include an alignment layer contacting the first side of the liquid crystal layer.

In an exemplary embodiment, the compensation film may be a λ/4 plate.

In an exemplary embodiment, in-plane retardation ($R_e$) of the liquid crystal layer for 450 nm, 550 nm, and 650 nm wavelengths may satisfy a following Relationship 1.

$$R_e(450 \text{ nm}) < R_e(550 \text{ nm}) \leq R_e(650 \text{ nm}) \quad \text{[Relationship 1]}$$

In the Relationship 1,
$R_e$ (450 nm) is in-plane retardation for incident light of a 450 nm wavelength,
$R_e$ (550 nm) is in-plane retardation for incident light of a 550 nm wavelength, and
$R_e$ (650 nm) is in-plane retardation for incident light of a 650 nm wavelength.

In an exemplary embodiment, the short wavelength dispersion of the liquid crystal layer may satisfy a following Relationship 2.

$$0.7 \leq R_e(450 \text{ nm})/R_e(550 \text{ nm}) < 1.0 \quad \text{[Relationship 2]}$$

In the Relationship 2,
$R_e$ (450 nm) is in-plane retardation for incident light of a 450 nm wavelength, and
$R_e$ (550 nm) is in-plane retardation for incident light of a 550 nm wavelength.

In an exemplary embodiment, a color shift of the anti-reflection film at about 60° of viewing angle may be less than about 7.0.

According to another exemplary embodiment, an OLED includes an organic light emitting panel and an anti-reflection film, wherein the anti-reflection film includes a polarizer and a compensation film positioned on the polarizer and including a liquid crystal layer, and the liquid crystal layer includes liquid crystals having oriented direction tilting obliquely with respect to the surface.

In an exemplary embodiment, the liquid crystal layer may include a first side and a second side facing each other, and tilt angles of the liquid crystals may become gradually larger from the first side to the second side.

In an exemplary embodiment, the first side of the liquid crystal layer may be positioned at the side of the polarizer, and the second side of the liquid crystal layer may be positioned at the side of the organic light emitting panel.

In an exemplary embodiment, a maximum tilt angle of the liquid crystals may range from about 30° to about 75°.

In an exemplary embodiment, the tilt angle of the liquid crystals positioned at the first side may be greater than about 0° and less than or equal to about 5°.

In an exemplary embodiment, the compensation film may further include an alignment layer contacting the first side of the liquid crystal layer.

In an exemplary embodiment, the compensation film may be a λ/4 plate.

In an exemplary embodiment, the in-plane retardation ($R_e$) of the liquid crystal layer for 450 nm, 550 nm, and 650 nm wavelengths may satisfy a following Relationship 1.

$$R_e(450 \text{ nm}) < R_e(550 \text{ nm}) \leq R_e(650 \text{ nm}) \quad \text{[Relationship 1]}$$

In the Relationship 1,
$R_e$ (450 nm) is in-plane retardation for incident light of a 450 nm wavelength,
$R_e$ (550 nm) is in-plane retardation for incident light of a 550 nm wavelength, and
$R_e$ (650 nm) is in-plane retardation for incident light of a 650 nm wavelength.

In an exemplary embodiment, the short wavelength dispersion of the liquid crystal layer may satisfy a following Relationship 2.

$$0.7 \leq R_e(450 \text{ nm})/R_e(550 \text{ nm}) < 1.0 \quad \text{[Relationship 2]}$$

In the Relationship 2, $R_e$ (450 nm) is in-plane retardation for incident light of a 450 nm wavelength, and $R_e$ (550 nm) is in-plane retardation for incident light of a 550 nm wavelength.

In an exemplary embodiment, a color shift of the anti-reflection film at about 60° of viewing angle may be less than about 7.0.

Since a conventionally-developed circular polarizing plate has strong viewing angle dependency, visibility may be deteriorated toward the side. In order to compensate the deteriorated visibility, a compensation film may be laminated, but it increases the entire thickness of the OLED and thus thinness is difficult to realize. In contrast, exemplary embodiments of an anti-reflection film improve display characteristics by decreasing viewing angle dependency without increasing a thickness.

DETAILED DESCRIPTION

Figure 1:
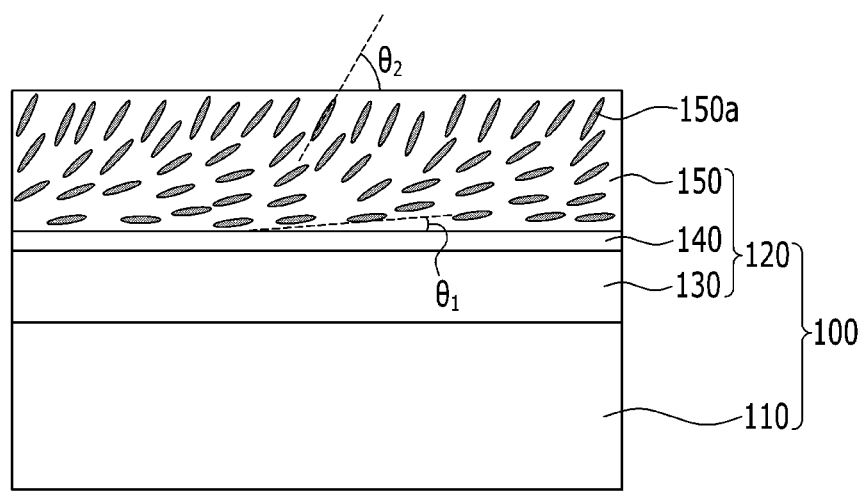
FIG. 1 is a cross-sectional view showing an anti-reflection film according to one exemplary embodiment.

Exemplary embodiments of the invention will hereinafter be described in detail, and may be easily performed by those who have common knowledge in the related art. However, this disclosure may be embodied in many different forms, and is not construed as limited to the exemplary embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, an anti-reflection film according to one exemplary embodiment is described referring to drawings.

FIG. 1 is a cross-sectional view showing an anti-reflection film according to one exemplary embodiment.

Referring to FIG. 1, an anti-reflection film 100 according to one exemplary embodiment includes a polarizer 110 and a compensation film 120.

The polarizer 110 may be disposed at the side where the light enters, and may be a linear polarizer shifting the polarization of incident light into linear polarization.

In an exemplary embodiment, the polarizer 110 may include, for example, elongated polyvinyl alcohol ("PVA") according to a method of, for example, stretching a polyvinyl alcohol film, adsorbing iodine or a dichroic dye thereto, and treating it with boric acid and washing the same.

In an exemplary embodiment, the polarizer 110 may be, for example, a polarizing film prepared by melt-blending a polymer resin and a dichroic dye, and the polarizing film may be, for example, made by mixing a polymer and a dichroic dye and melting the combination at a temperature above the melting point of the polymer resin to manufacture it in a form of a sheet.

The compensation film 120 circularly polarizes linearly polarized light passed through the polarizer 110 to generate phase retardation, and may be, for example, a λ/4 plate. The λ/4 plate may have in-plane retardation ($R_e$) of, for example, about 120 nanometers (nm) to about 160 nm for incident light of a 550 nm wavelength.

The compensation film 120 includes a substrate 130, an alignment layer 140, and a liquid crystal layer 150.

In an exemplary embodiment, the substrate 130 may be, for example, a glass substrate or a polymer substrate, and the polymer substrate may be a substrate including, for example, polyethylene terephthalate ("PET"), PVA, polycarbonate ("PC"), triacetyl cellulose ("TAC"), a derivative thereof, and/or a combination thereof, but is not limited thereto. When the compensation film 120 includes another lower layer besides the substrate, the substrate 130 may be the lower layer. However, the invention is not limited thereto, and the substrate 130 may be omitted as needed.

The alignment layer 140 may provide a pretilt angle with the post-described liquid crystals, and thus control alignment of the liquid crystals. In an exemplary embodiment, the alignment layer 140 may include polyamic acid, polyimide, or a combination thereof, for example. The surface of the alignment layer 140 may include a plurality of grooves formed through a physical treatment such as rubbing on the surface or a photo-treatment such as photo-alignment.

The liquid crystal layer 150 may include a plurality of liquid crystals 150a having oriented direction tilting obliquely with respect to the surface of the liquid crystal layer 150 extending in a horizontal direction in a cross sectional view. Herein, the tilting obliquely with respect to the surface of the liquid crystal layer 150 means that the liquid crystals are not vertically or horizontally aligned with the length direction of the liquid crystal layer 150, and the optical axis of each liquid crystal 150a may be tilted at an angle of greater than 0° to less than 90° with the length direction of the liquid crystal layer 150.

An angle at which the optical axis of the liquid crystal 150a is tilted with a respect to the surface of the liquid crystal layer 150 (hereinafter referred to as 'a tilt angle') may change along the thickness direction of the liquid crystal layer 150, for example, the tilt angle of the liquid crystals 150a may gradually change along the thickness direction of the liquid crystal layer 150.

In an exemplary embodiment, for example, when the liquid crystal layer 150 has a first side contacting the alignment layer 140 and a second side contacting air, the tilt angle of the liquid crystals 150a may become gradually larger from the first side to the second side.

In an exemplary embodiment, for example, the tilt angle ($\theta_1$) of the liquid crystals 150a at the first side close to a lower surface of the liquid crystal layer 150 may be a pretilt angle caused by the alignment layer 140, for example, ranging from greater than about 0° to less than or equal to about 5°. In an exemplary embodiment, the tilt angle ($\theta_1$) may be, for example, in a range of about 2° to about 5° within the range.

The tilt angle ($\theta_2$) of the liquid crystals 150a at the second side close to an upper surface of the liquid crystal layer 150 may be a maximum tilt angle, for example, in a range of about 30° to about 75°. In an exemplary embodiment, the maximum tilt angle may be, for example, in a range of about 35° to about 70°, and for example, about 40° to about 60° within the range.

The liquid crystal layer 150 may have reverse wavelength dispersion phase delay. The phase delay may be represented by in-plane retardation ($R_e$), and the in-plane retardation ($R_e$) may be represented by $R_e=(n_x-n_y)d$. Herein, $n_x$ is a refractive index in a direction having a highest refractive index in a plane of the liquid crystal layer 150 (hereinafter referred to as "a slow axis"), $n_y$ is a refractive index in a direction having a lowest refractive index in a plane of the liquid crystal layer 150 (hereinafter referred to as "a fast axis"), and d is a thickness of the liquid crystal layer 150.

The reverse wavelength dispersion phase delay has higher retardation to light of long wavelengths than retardation to light of short wavelengths, and in-plane retardation ($R_e$) of the liquid crystal layer 150 for a 450 nm, 550 nm, and 650 nm wavelengths may, for example, satisfy the following Relationship 1.

$R_e(450 \text{ nm}) < R_e(550 \text{ nm}) \leq R_e(650 \text{ nm})$ [Relationship 1]

In Relationship 1,
$R_e$ (450 nm) is in-plane retardation for incident light of a 450 nm wavelength,
$R_e$ (550 nm) is in-plane retardation for incident light of a 550 nm wavelength, and
$R_e$ (650 nm) is in-plane retardation for incident light of a 650 nm wavelength.

The wavelength dispersion of the liquid crystal layer 150 may satisfy the following Relationship 2.

$0.7 \leq R_e(450 \text{ nm})/R_e(550 \text{ nm}) < 1.0$ [Relationship 2]

In Relationship 2,
$R_e$ (450 nm) is in-plane retardation for incident light of a 450 nm wavelength, and
$R_e$ (550 nm) is in-plane retardation for incident light of a 550 nm wavelength.

In an exemplary embodiment, for example, the wavelength dispersion of the liquid crystal layer 150 may satisfy the following Relationship 2a.

$0.72 \leq R_e(450 \text{ nm})/R_e(550 \text{ nm}) \leq 0.92$ [Relationship 2a]

In an exemplary embodiment, for example, the wavelength dispersion of the liquid crystal layer 150 may satisfy the following Relationship 2b.

$0.80 \leq R_e(450 \text{ nm})/R_e(550 \text{ nm}) \leq 0.85$ [Relationship 2b]

The liquid crystal layer 150 includes a plurality of liquid crystals 150a having obliquely-tilted oriented direction, and the tilt angle of the liquid crystals 150a may be changed along the thickness direction of the liquid crystal layer 150, and accordingly circularly-polarized light effect is equally realized in all directions and external light is effectively prevented from reflection at the side as well as the front, resultantly improving side visibility.

In an exemplary embodiment, the liquid crystal 150a may have a rod shape extended in one direction, and may be, for example, a monomer, an oligomer, and/or a polymer. In an exemplary embodiment, the liquid crystal 150a may have, for example, positive or negative birefringence values ($\Delta n$). The birefringence ($\Delta n$) is a difference found by subtracting the refractive index ($n_e$) of light vibrating parallel to an oriented direction from the refractive index ($n_o$) of light vibrating perpendicular to the oriented direction.

In an exemplary embodiment, the liquid crystal 150a may be a reactive mesogen liquid crystal, and may include, for example, at least one mesogenic moiety and at least one polymerizable functional group. In an exemplary embodiment, the reactive mesogen liquid crystal may include at least one of, for example, a rod-shaped aromatic derivative including at least one reactive cross-linking group, propylene glycol 1-methyl, propylene glycol 2-acetate, and a compound represented by $P^1$-$A^1$-$(Z^1$-$A^2)_n$-$P^2$ (wherein $P^1$ and $P^2$ independently include a polymerizationic functional group such as acrylate, methacrylate, acryloyl, vinyl, vinyloxy, epoxy, or a combination thereof, $A^1$ and $A^2$ independently include 1,4-phenylene, naphthalene-2,6-diyl group, or a combination thereof, $Z^1$ includes a single bond, —COO—, —OCO—, or a combination thereof, and n is 0, 1, or 2), but is not limited thereto.

In an exemplary embodiment, the liquid crystal 150a may be a thermosetting liquid crystal or a photocurable liquid crystal, and for example, the liquid crystal 150a may be a photocurable liquid crystal. In an exemplary embodiment, when the liquid crystal 150a is a photocurable liquid crystal, the light may be ultraviolet ("UV") rays having a wavelength ranging from about 250 nm to about 400 nm.

In an exemplary embodiment, the liquid crystal 150a may be cross-linkable liquid crystals, and for example, a compound represented by one of the following Chemical Formula 1A to 1F.

[Chemical Formula 1A]

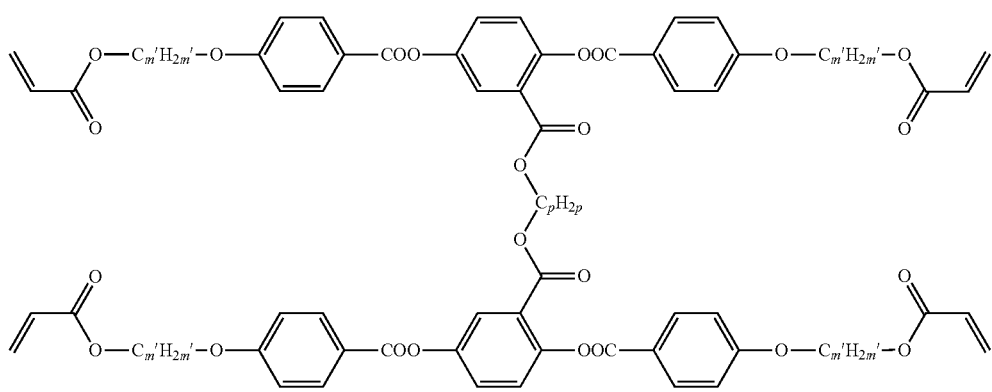

[Chemical Formula 1B]

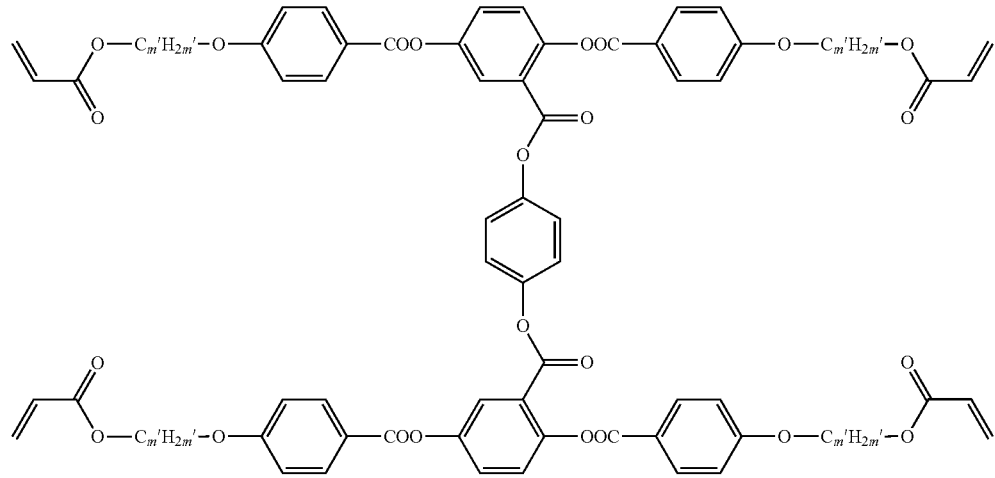

[Chemical Formula 1F]

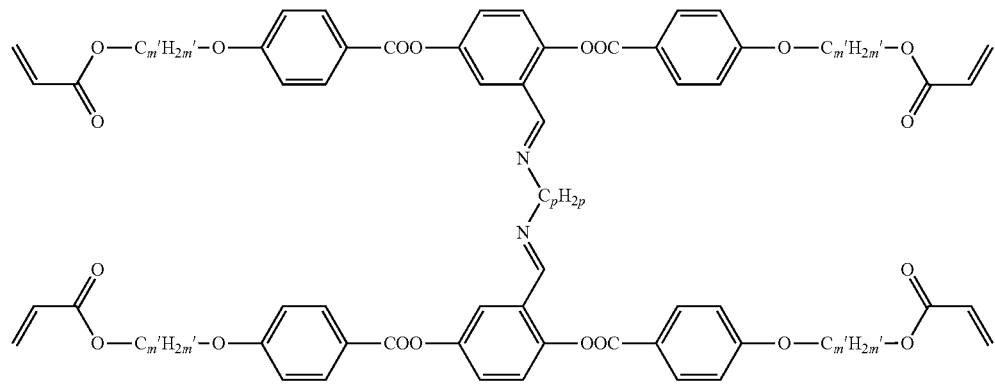

In Chemical Formulae 1A to 1F, m' is an integer of 4 to 12, and p is an integer of 2 to 12.

In an exemplary embodiment, the liquid crystal 150a may include a compound represented by the following Chemical Formula 2A.

[Chemical Formula 2A]

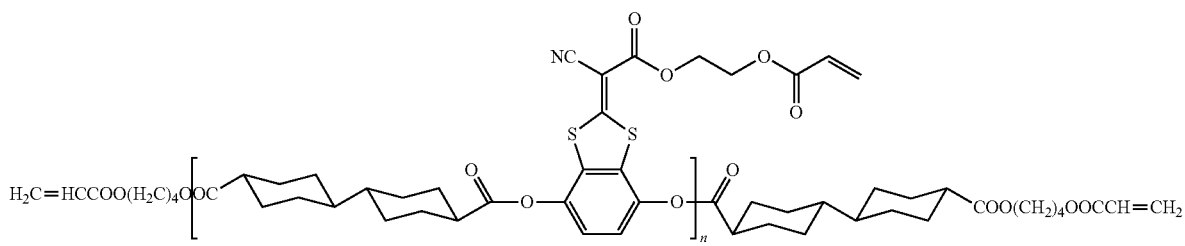

In Chemical Formula 2A, n is an integer of 2 to 10.

In an exemplary embodiment, for example, the liquid crystal 150a may include a compound represented by one of the following Chemical Formulae 3A to 3E.

[Chemical Formula 3A]
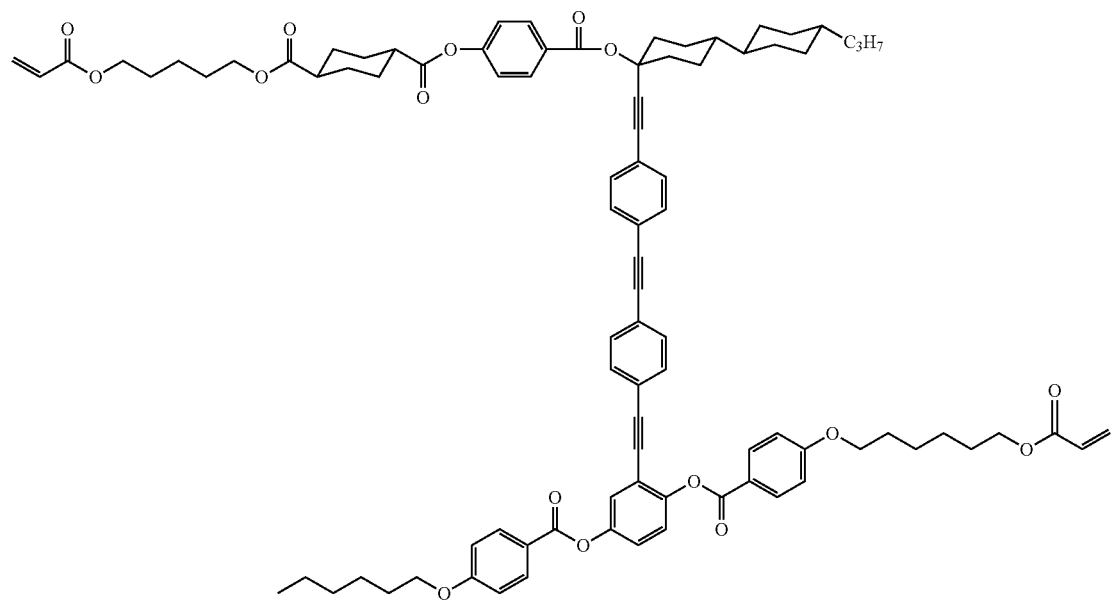
[Chemical Formula 3B]
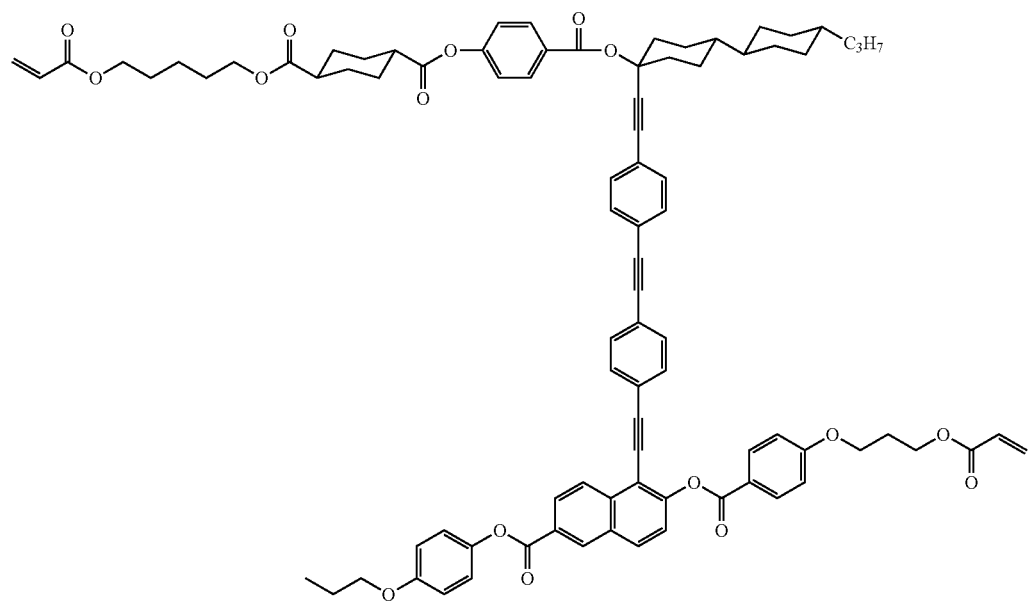

[Chemical Formula 3C]
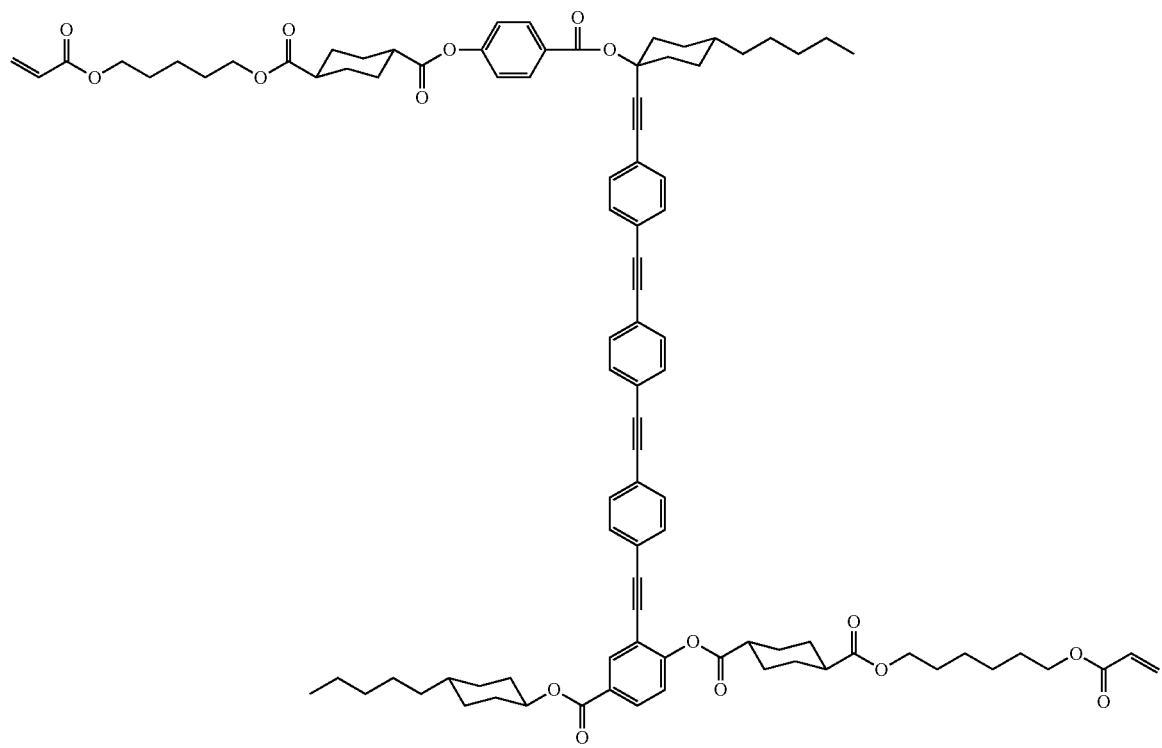
[Chemical Formula 3D]
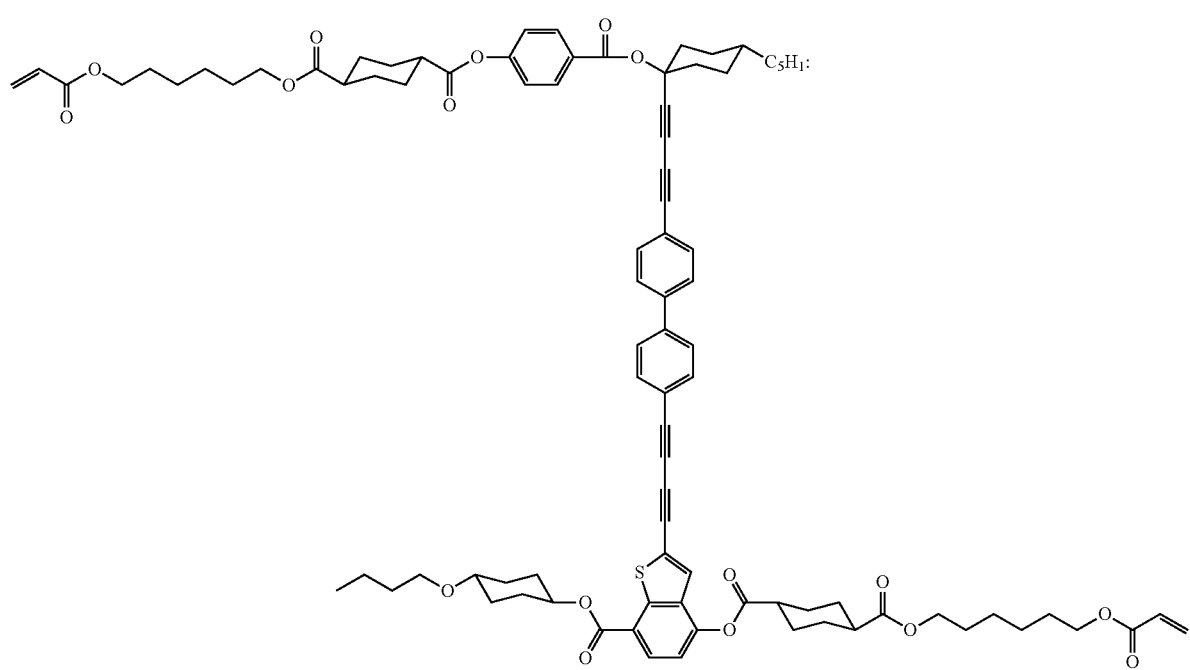

[Chemical Formula 3E]
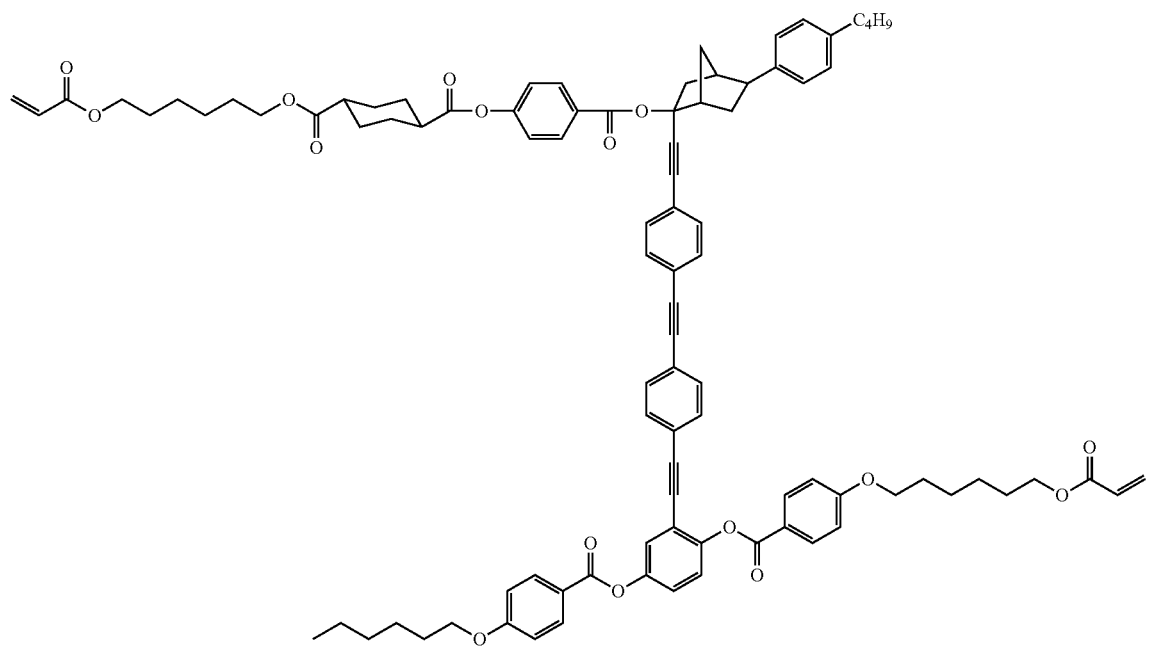
In an exemplary embodiment, the liquid crystal 150*a* may include a compound represented by the following Chemical Formula 4A or 4B.
[Chemical Formula 4A]
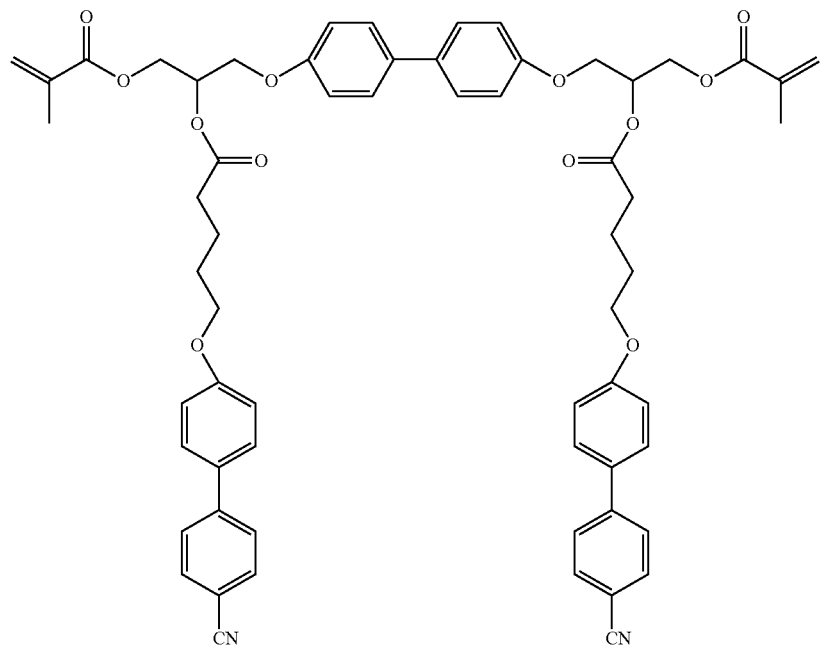

-continued

[Chemical Formula 4B]

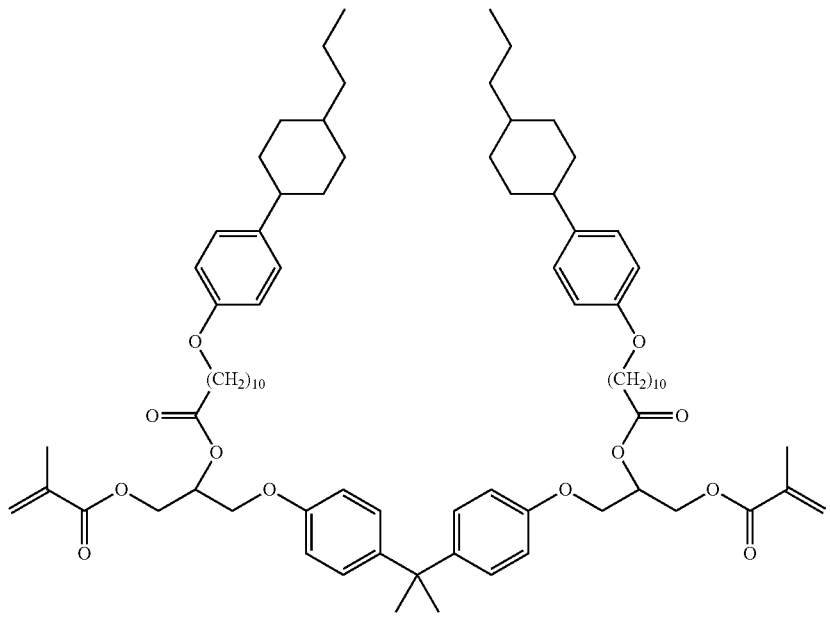

The liquid crystal layer 150 may include one or more kinds of liquid crystal 150*a*.

In an exemplary embodiment, the liquid crystal layer 150 may include a composition including the liquid crystal 150*a*, and the composition may include various additives such as a reaction initiator, a surfactant, a dissolution assistant and/or a dispersing agent, and a solvent, other than the liquid crystal 150*a*. In an exemplary embodiment, the composition may be applied through a solution process, for example, spin coating, slit coating, bar coating, and/or inkjet coating, and the thickness of the liquid crystal layer 150 may be adjusted in consideration of a refractive index and the like.

In an exemplary embodiment, an adhesion layer (not shown) may be further disposed between the polarizer 110 and the compensation film 120. In an exemplary embodiment, the adhesion layer is used to effectively attach the polarizer 110 to the compensation film 120, and may include, for example, a pressure sensitive adhesive.

The anti-reflection film 100 may further include a protective layer (not shown) on the polarizer 110. In an exemplary embodiment, the protective layer may be provided for further reinforcing the functionality or improving the durability of the anti-reflection film 100, or for reducing reflection or glare, and for example, may include a triacetyl cellulose ("TAC") film, but is not limited thereto.

The anti-reflection film 100 may further include a correction layer (not shown) positioned on the compensation film 120. In an exemplary embodiment, the correction layer may be, for example, a color shift resistant layer, but is not limited thereto.

The anti-reflection film 100 may further include a light blocking layer (not shown) extended along the edge. The light-blocking layer may further include a light blocking layer (not shown) extended along the circumference of the anti-reflection film 100. In an exemplary embodiment, the light-blocking layer may include an opaque material, for example, a black material. In an exemplary embodiment, the light-blocking layer may include a black ink, for example.

In an exemplary embodiment, the anti-reflection film 100 may be stacked with the polarizer 110 and the compensation film 120 by a roll-to-roll method, for example, but is not limited thereto.

Figure 2:
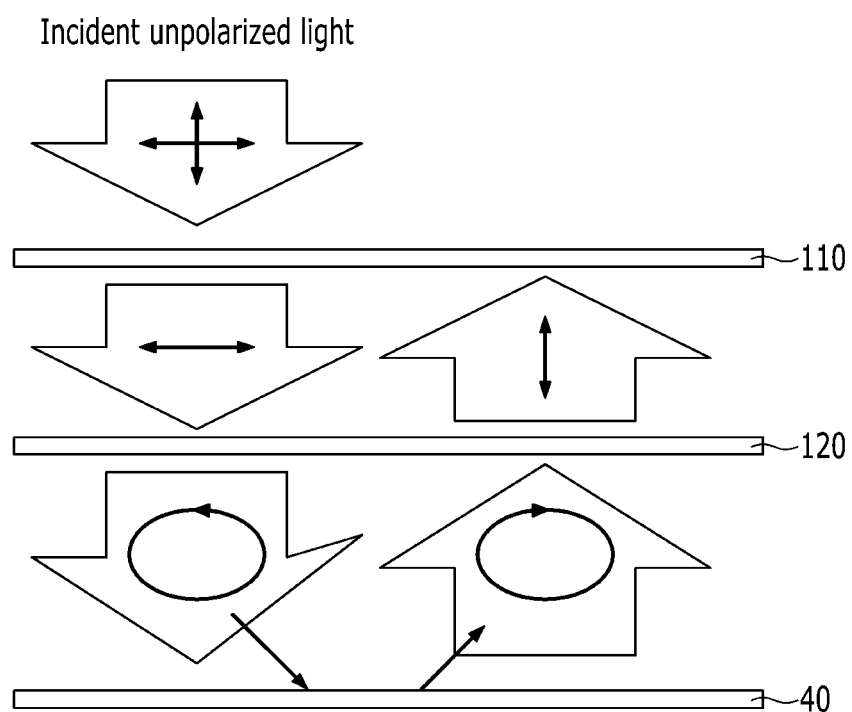
FIG. 2 is a schematic view showing one exemplary embodiment of an external light anti-reflection principle of an anti-reflection film.

FIG. 2 is a schematic view showing the external light anti-reflection principle of an anti-reflection film according to one exemplary embodiment.

Referring to FIG. 2, while the incident unpolarized light (hereinafter also referred to be as 'external light') having entered from the outside is passed through the polarizer 110, only a first polarized perpendicular component, which is one polarized perpendicular component of two polarized perpendicular components, is transmitted, and the polarized light is shifted into circularly polarized light by passing through the compensation film 120. While the circularly polarized light is reflected in a display panel 40 including a substrate, an electrode, and so on, and changes the circular polarization direction, and the circularly polarized light is passed through the compensation film 120 again, only a second polarized perpendicular component, which is the other polarized perpendicular component of the two polarized perpendicular components, may be transmitted. As the second polarized perpendicular component is not passed through the polarizer 110, and light does not exit to the outside, effects of preventing the external light reflection may be provided.

Figure 3:
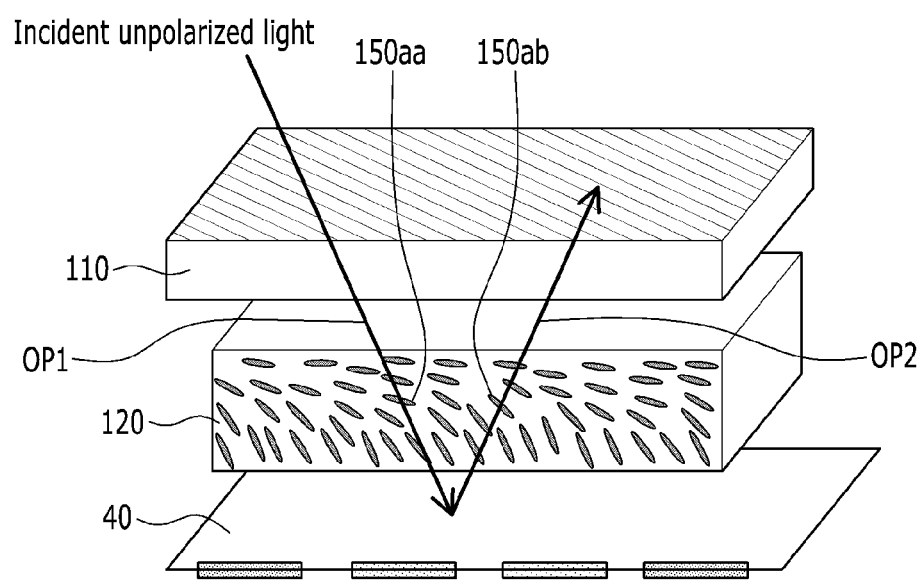
FIG. 3 is a schematic view showing one exemplary embodiment of a viewing angle improvement principle of an anti-reflection film.

FIG. 3 is a schematic view showing a viewing angle improvement principle of an anti-reflection film according to one exemplary embodiment.

Referring to FIG. 3, external light passes through a first optical path OP1 in which the light passes through the compensation film 120, reaches the display panel 40, and passes through a second optical path OP2 in which the light is reflected from the display panel 40 and repassed through the compensation film 120. The light has a polarization direction that is changed through the first and second optical paths OP1 and OP2 and does not pass through the polarizer 110, showing an external light anti-reflection effect.

Herein, the first and second optical paths OP1 and OP2 may substantially form a reverted image as a reference of the display panel 40. Accordingly, the compensation film 120 includes liquid crystals that are obliquely tilted and aligned in one direction, but when external light sequentially passes the first optical path OP1 and the second optical path OP2 having opposite directions from each other, a phase difference may be adjusted by summing the oblique alignment of liquid crystals 150aa in the first optical path OP1 and the oblique alignment of liquid crystals 150ab in the second optical path OP2. Accordingly, an anti-reflection effect may be substantially equivalent in all directions, and a color shift due to a reflection of external light at the side and at the front side may be effectively prevented, thereby improving side visibility.

The side visibility may be expressed as reflectance and a color shift at the side. In an exemplary embodiment, the reflectance of the anti-reflection film at about 60° of viewing angles may be less than or equal to about 1.5 percent (%), for example, less than or equal to about 1.2%, and for example, less than or equal to about 1.0% within the range. In an exemplary embodiment, the color shift of the anti-reflection film at about 60° viewing angles may be less than about 7.0, for example, less than or equal to about 6.0, and for example, less than or equal to about 5.0.

The anti-reflection film 100 may be applied to an organic light emitting device ("OLED").

Hereinafter, an OLED according to one exemplary embodiment is described referring to drawings.

Figure 4:
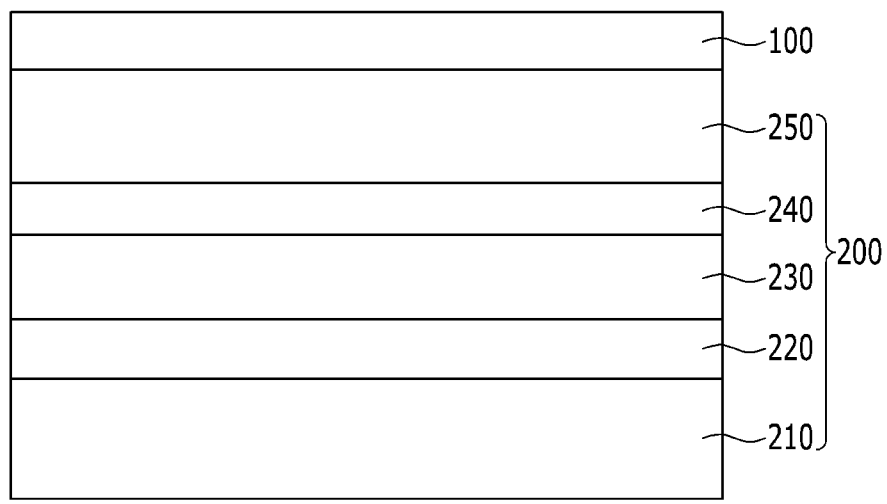
FIG. 4 is a cross-sectional view schematically showing one exemplary embodiment of an organic light emitting device.

FIG. 4 is a cross-sectional view schematically showing an OLED according to one exemplary embodiment.

Referring to FIG. 4, the OLED according to one exemplary embodiment includes an organic light emitting panel 200 and an anti-reflection film 100 positioned on the organic light emitting panel 200.

The organic light emitting panel 200 includes a base substrate 210, a lower electrode 220, an organic emission layer 230, an upper electrode 240, and an encapsulation substrate 250.

In an exemplary embodiment, the base substrate 210 may include glass or plastic, for example.

One of the lower electrode 220 and the upper electrode 240 may be an anode, and the other may be a cathode. The anode is an electrode into which holes are injected and may include a conductive material having a high work function, and the cathode is an electrode into which electrons are injected and may include a conductive material having a low work function. In an exemplary embodiment, at least one of the lower electrode 220 and the upper electrode 240 may include a transparent conductive material from which emitted light exits outside, for example, indium tin oxide ("ITO") or indium zinc oxide ("IZO").

The organic emission layer 230 includes an organic material which may emit light when applying a voltage to the lower electrode 220 and the upper electrode 240.

An auxiliary layer (not shown) may be further provided between the lower electrode 220 and the organic emission layer 230 and between the upper electrode 240 and the organic emission layer 230. In an exemplary embodiment, the auxiliary layer may include a hole transporting layer, a hole injecting layer, an electron injecting layer, and an electron transporting layer in order to balance electrons and holes, but is not limited thereto.

In an exemplary embodiment, the encapsulation substrate 250 may include glass, metal, or a polymer, for example, and may seal the lower electrode 220, the organic emission layer 230, and the upper electrode 240 to prevent moisture and/or oxygen inflow from the outside.

The anti-reflection film 100 may be disposed at the side emitting light. In an exemplary embodiment, in the case of a bottom emission structure emitting light at the side of the base substrate 210, the anti-reflection film 100 may be disposed on the exterior side of the base substrate 210. In another exemplary embodiment, in the case of a top emission structure emitting light at the side of the encapsulation substrate 250, the anti-reflection film 100 may be disposed on the exterior side of the encapsulation substrate 250.

The anti-reflection film 100 may prevent external light from being reflected by a metal such as an electrode of the organic light emitting panel 200, and from emitting outside of the OLED, thus improving display characteristics of the OLED.

In addition, the anti-reflection film 100 may not only show a substantially equivalent anti-reflection effect in all the directions, but may also effectively prevent a color shift due to refection of external light at the side as well as the front side as described above, and thus improve side visibility.

Hereinafter, the invention is illustrated in more detail with reference to examples. However, these examples are exemplary, and the invention is not limited thereto.

Simulation Evaluation

EXAMPLE 1

A simulation evaluation (LCD Master (Shintech Inc.)) is performed by simulation-setting of a structure of sequentially disposing a polarizer, a compensation film ($R_{e2}$=138 nm) including a liquid crystal layer, and a reflector. Herein, the liquid crystal layer of the compensation film has a bottom tilt structure in which a tilt angle becomes larger from top to bottom, that is, a minimum tilt angle (an upper tilt angle) is about 3° and a maximum tilt angle (a lower tilt angle) is about 37°, between which a tilt angle gradually changes. The angle of an axis of the polarizer is set at about 90° and the angle of an axis of the compensation film is set at about 45°.

EXAMPLE 2

A simulation condition is set according to the same method as Example 1, except for setting the maximum tilt angle (the lower tilt angle) of a liquid crystal at about 45° in the liquid crystal layer.

EXAMPLE 3

A simulation condition is set according to the same method as Example 1, except for setting the maximum tilt angle (the lower tilt angle) of a liquid crystal at about 65° in the liquid crystal layer.

EXAMPLE 4

A simulation condition is set according to the same method as Example 1, except for making the liquid crystal layer of the compensation film have a top tilt structure in which a tilt angle becomes larger from bottom to top and setting the maximum tilt angle (the upper tilt angle) of a liquid crystal at about 65° in the liquid crystal layer.

EXAMPLE 5

A simulation condition is set according to the same method as Example 1, except for setting the maximum tilt angle (the lower tilt angle) of a liquid crystal at about 75° in the liquid crystal layer.

EXAMPLE 6

A simulation condition is set according to the same method as Example 1, except for setting the maximum tilt angle (the lower tilt angle) of a liquid crystal at about 30° in the liquid crystal layer.

COMPARATIVE EXAMPLE 1

A simulation condition is set according to the same method as Example 1, except that the liquid crystal layer includes a plurality of liquid crystals having a tilt angle of about 0° (plate A).

COMPARATIVE EXAMPLE 2

A simulation condition is set according to the same method as Example 1, except that the compensation film includes two liquid crystal layers, of which one liquid crystal layer includes a plurality of liquid crystals having a tilt angle of about 0° (plate A) while the other liquid crystal layer includes a plurality of liquid crystals having a tilt angle of about 90° (plate C).

Evaluation
<Evaluation 1>

The reflectance and color shift of each anti-reflection film according to Examples 1 to 6 and Comparative Examples 1 and 2 at the front side and the side are evaluated.

The reflectance and color shift are evaluated through simulation by using LCD Master (Shintech Inc.).

The results are illustrated referring to Table 1 and FIGS. 5 to 8.

Figure 5:
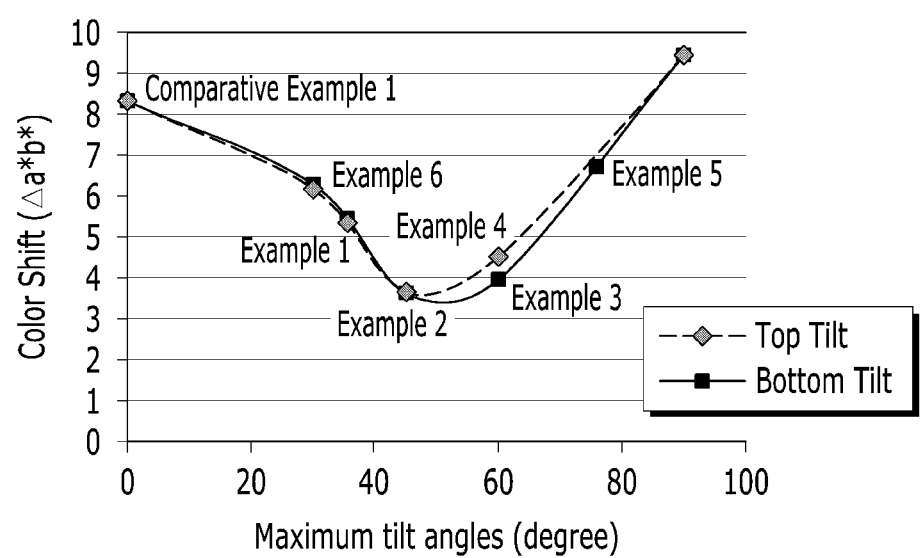
FIG. 5 is a graph showing a relationship between maximum tilt angles of liquid crystals and color shifts at about 60° of viewing angles of the anti-reflection films according to Examples 1 to 6 and Comparative Examples 1 and 2.
Figure 6:
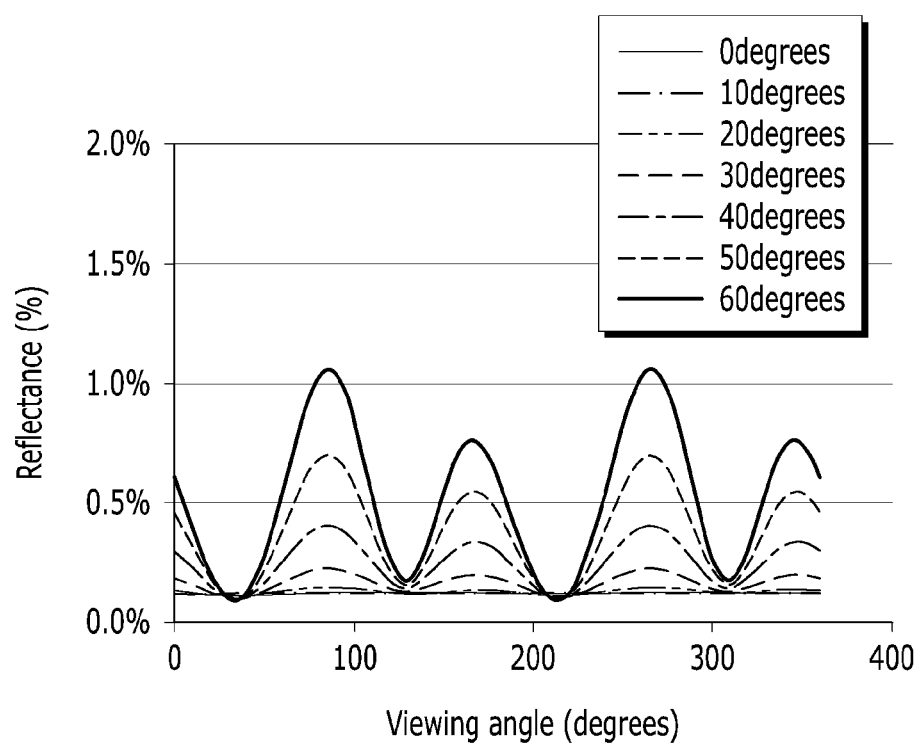
FIG. 6 is a graph showing reflectance in terms of percentage depending on a viewing angle in terms of degree in all directions of the anti-reflection film according to Example 2.
Figure 7:
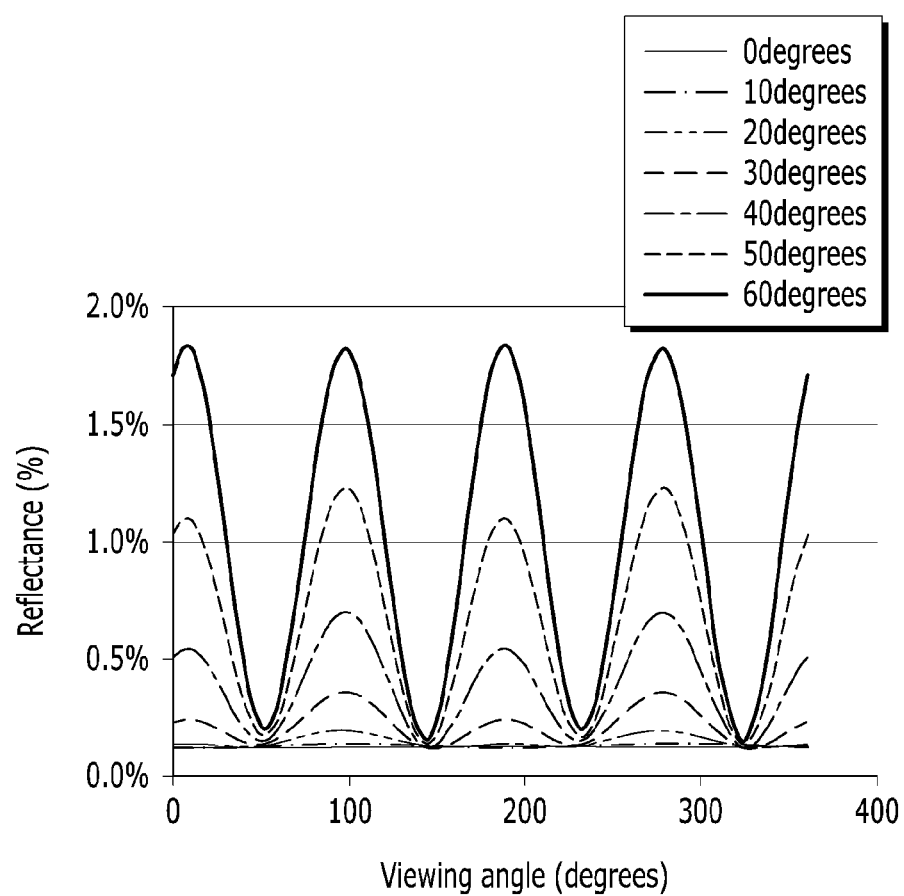
FIG. 7 is a graph showing reflectance in terms of percentage depending on a viewing angle in terms of degree in all directions of the anti-reflection film according to Comparative Example 1.
Figure 8:
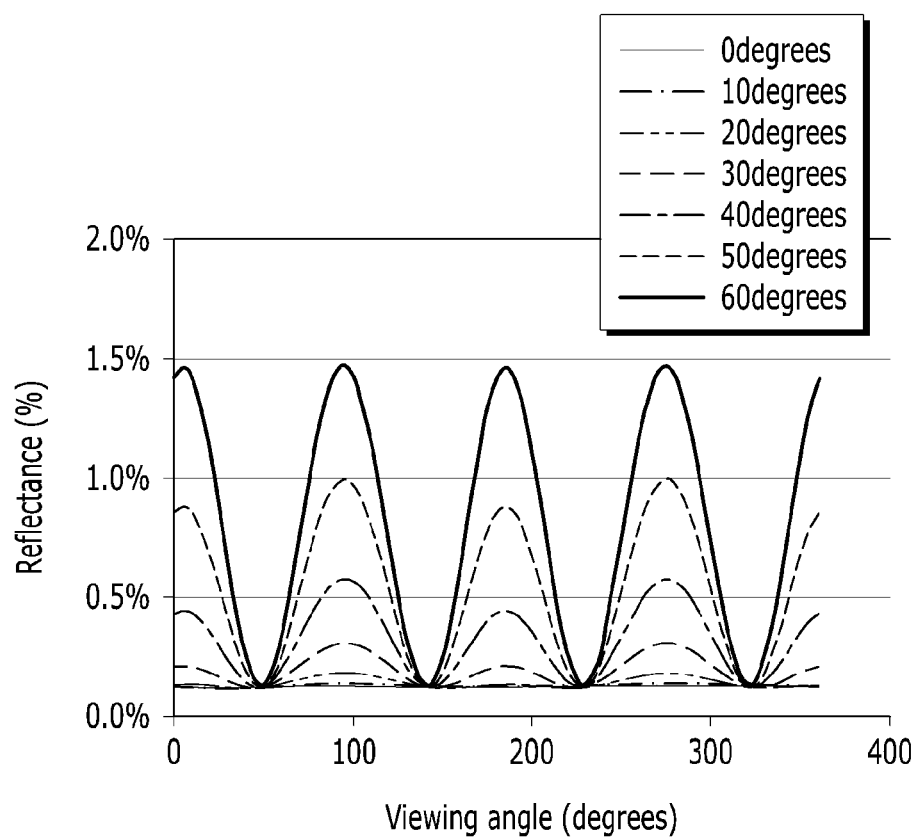
FIG. 8 is a graph showing reflectance in terms of percentage depending on a viewing angle in terms of degree in all directions of the anti-reflection film according to Comparative Example 2.

FIG. 5 is a graph showing a relationship between maximum tilt angles of liquid crystals and color shifts at about 60° viewing angles of the anti-reflection films according to Examples 1 to 6 and Comparative Examples 1 and 2, FIG. 6 is a graph showing reflectance depending on a viewing angle in all directions of the anti-reflection film according to Example 2, FIG. 7 is a graph showing reflectance depending on a viewing angle in all directions of the anti-reflection film according to Comparative Example 1, and FIG. 8 is a graph showing reflectance depending on a viewing angle in all directions of the anti-reflection film according to Comparative Example 2.

TABLE 1

|  | Front | | Side (60°) | |
| --- | --- | --- | --- | --- |
| In-phase retardation ($R_e$) (nm) | Reflectance (%) | Color shift ($\Delta a^*b^*$) | Reflectance (%) | Color shift ($\Delta a^*b^*$) |
| Example 1 | 138 | 0.12 | 3.7 | 0.64 | 5.4 |
| Example 2 | 138 | 0.12 | 3.2 | 0.59 | 3.7 |
| Example 3 | 138 | 0.12 | 3.5 | 0.93 | 4.5 |
| Example 4 | 138 | 0.12 | 3.5 | 0.80 | 5.1 |
| Example 5 | 138 | 0.13 | 4.3 | 1.45 | 6.9 |
| Example 6 | 138 | 0.13 | 3.2 | 0.73 | 6.4 |

TABLE 1-continued

|  | Front | | Side (60°) | |
| --- | --- | --- | --- | --- |
| In-phase retardation ($R_e$) (nm) | Reflectance (%) | Color shift ($\Delta a^*b^*$) | Reflectance (%) | Color shift ($\Delta a^*b^*$) |
| Comparative Example 1 | 138 | 0.12 | 3.2 | 1.04 | 8.2 |
| Comparative Example 2 | 138 | 0.13 | 4.28 | 0.81 | 7.0 |

Referring to Table 1 and FIG. 5, the anti-reflection films according to Examples 1 to 6 showed remarkably lower color shift at the side (e.g., 60°) than the anti-reflection film according to Comparative Example 1. In addition, the anti-reflection films according to Examples 1 to 6 include a single compensation film, but show an equivalent or improved color shift compared with the anti-reflection film including double compensation films according to Comparative Example 2.

In addition, referring to FIGS. 6 to 8, the anti-reflection film according to Example 2 shows low reflectance in every direction (0° to 360°) compared with the anti-reflection films according to Comparative Examples 1 and 2. In FIGS. 6 to 8, the horizontal axis means azimuth angles of reflection evaluation and the angles in the box means inclination angles of reflection evaluation from the perpendicular direction to the film plane.

Accordingly, the anti-reflection films according to Examples 1 to 6 improve visibility at the side without increasing a thickness of the anti-reflection film.

While this invention has been described in connection with what is presently considered to be practical exemplary embodiments, it is to be understood that the invention is not limited to the disclosed exemplary embodiments, but, on the contrary, is intended to cover various modifications and equivalent alignments included within the spirit and scope of the appended claims.

What is claimed is:

1. An anti-reflection film for an organic light emitting device, the anti-reflection film comprising:
   a polarizer; and
   a compensation film including
      a single liquid crystal layer which comprises liquid crystals having an oriented direction which are tilted obliquely with respect to a surface of the single liquid crystal layer, and which extend in a horizontal direction in a cross sectional view,
   wherein
   the single liquid crystal layer comprises a first side and a second side facing each other,
   tilt angles of the liquid crystals become gradually larger from the first side to the second side,
   an in-plane retardation of the single liquid crystal layer for 450 nanometer, 550 nanometer, and 650 nanometer wavelength light satisfies Relationship 1, $$R_e(450 \text{ nm}) < R_e(550 \text{ nm}) \leq R_e(650 \text{ nm}) \quad \text{Relationship 1}$$

wherein, in Relationship 1,
   $R_e$ (450 nm) is the in-plane retardation for incident light having a wavelength of 450 nanometers,
   $R_e$ (550 nm) is the in-plane retardation for incident light having a wavelength of 550 nanometers, and
   $R_e$ (650 nm) is the in-plane retardation for incident light having a wavelength of 650 nanometers, and wherein the anti-reflection film is disposed on a side of an organic light emitting panel from which light is emitted, and wherein the compensation film is disposed between the organic light emitting panel and the polarizer.

2. The anti-reflection film of claim 1, wherein the first side of the single liquid crystal layer faces the polarizer.

3. The anti-reflection film of claim 1, wherein a maximum tilt angle of the liquid crystals with respect to the surface of the single liquid crystal layer ranges from about 30° to about 75°.

4. The anti-reflection film of claim 1, wherein a tilt angle of the tilt angles of the liquid crystals positioned at the first side is greater than about 0° and less than or equal to about 5°.

5. The anti-reflection film of claim 1, wherein the compensation film further comprises an alignment layer contacting the first side of the single liquid crystal layer.

6. The anti-reflection film of claim 1, wherein the compensation film is a λ/4 plate.

7. The anti-reflection film of claim 1, wherein wavelength dispersion of the single liquid crystal layer satisfies a following Relationship 2:

$$0.7 \leq R_e(450 \text{ nm})/R_e(550 \text{ nm}) < 1.0 \quad \text{Relationship 2}$$

wherein, in the Relationship 2, $R_e$ (450 nm) is the in-plane retardation for incident light having a wavelength of 450 nanometers, and $R_e$ (550 nm) is the in-plane retardation for incident light having a wavelength of 550 nanometers.

8. The anti-reflection film of claim 1, wherein a color shift of the anti-reflection film at about 60° of a viewing angle is less than about 7.0.

9. An organic light emitting device comprising an organic light emitting panel; and an anti-reflection film disposed on a side of the organic light emitting panel from which light is emitted, wherein the anti-reflection film comprises:
a polarizer, and
a compensation film comprising a single liquid crystal layer which comprises:
liquid crystals having an oriented direction, which are tilted obliquely with respect to a surface of the single liquid crystal layer, and which extend in a horizontal direction in a cross sectional view, wherein the single liquid crystal layer comprises a first side and a second side facing each other, tilt angles of the liquid crystals become gradually larger from the first side to the second side, an in-plane retardation of the single liquid crystal layer for 450 nanometer, 550 nanometer, and 650 nanometer wavelength light satisfies a following Relationship 1, $$R_e(450 \text{ nm}) < R_e(550 \text{ nm}) \leq R_e(650 \text{ nm}) \quad \text{Relationship 1}$$

wherein, in the Relationship 1, $R_e$ (450 nm) is the in-plane retardation for incident light having a wavelength of 450 nanometers, $R_e$ (550 nm) is the in-plane retardation for incident light having a wavelength of 550 nanometers, and $R_e$ (650 nm) is the in-plane retardation for incident light having a wavelength of 650 nanometers, and wherein the compensation film is disposed between the organic light emitting panel and the polarizer.

10. The organic light emitting device of claim 9, wherein the first side of the single liquid crystal layer faces the polarizer, and the second side of the single liquid crystal layer faces a side of the organic light emitting panel.

11. The organic light emitting device of claim 9, wherein a maximum tilt angle of the liquid crystals with respect to the surface of the single liquid crystal layer ranges from about 30° to about 75°.

12. The organic light emitting device of claim 9, wherein a tilt angle of the tilt angles of the liquid crystals positioned at the first side is greater than about 0° and less than or equal to about 5°.

13. The organic light emitting device of claim 9, wherein the compensation film further comprises an alignment layer contacting the first side of the single liquid crystal layer.

14. The organic light emitting device of claim 9, wherein the compensation film is a λ/4 plate.

15. The organic light emitting device of claim 9, wherein short wavelength dispersion of the single liquid crystal layer satisfies a following Relationship 2:

$$0.7 \leq R_e(450 \text{ nm})/R_e(550 \text{ nm}) < 1.0 \quad \text{Relationship 2}$$

wherein, in the Relationship 2, $R_e$ (450 nm) is the in-plane retardation for incident light having a wavelength of 450 nanometers, and $R_e$ (550 nm) is the in-plane retardation for incident light having a wavelength of 550 nanometers.

16. The organic light emitting device of claim 9, wherein a color shift of the anti-reflection film at 60° of a viewing angle is less than about 7.0.

* * * * *